United States Patent [19]

Tiemann

[11] 4,284,909
[45] Aug. 18, 1981

[54] CHARGE DOMAIN FILTER WITH A PLURALITY OF TRANSMISSION ZEROS

[75] Inventor: Jerome J. Tiemann, Schenectady, N.Y.

[73] Assignee: General Electric Company, Schenectady, N.Y.

[21] Appl. No.: 153,702

[22] Filed: May 27, 1980

[51] Int. Cl.³ .................. G11C 19/28; H01L 29/78; H03H 15/02
[52] U.S. Cl. .................. 307/221 D; 357/24; 333/165
[58] Field of Search .......... 357/24; 307/221 D; 333/165

[56] References Cited

U.S. PATENT DOCUMENTS

| 4,032,867 | 6/1977 | Engeler et al. ............ 307/221 D |
| 4,163,957 | 8/1979 | Knauer et al. ............. 333/165 |
| 4,213,105 | 7/1980 | Knauer et al. ............. 333/165 |

FOREIGN PATENT DOCUMENTS 2004692  4/1979  United Kingdom ............ 357/24

*Primary Examiner*—Gene M. Munson

*Attorney, Agent, or Firm*—Julius J. Zaskalicky; James C. Davis, Jr.; Marvin Snyder

[57] ABSTRACT

A filter is described utilizing charge transfer devices for implementing transmission zeros. A first shift register is provided having a plurality of M stages, where M is an integer, each stage including a respective first charge storage region. A second shift register is provided having a plurality of N stages where N is an integer greater than M, each stage including a respective first charge storage region. A first sequence of packets of charge is provided, each packet representing a respective sample of an input signal. Each of the packets of charge of the sequence is divided into a first part and a second part equal to the first part. Each of the first parts of the packets of the first sequence is applied to the first shift register and transferred from stage to stage thereof at one frequency. Each of the second parts of the packets of the first sequence is applied to the second shift register and transferred from stage to stage thereof at the aforementioned one frequency. The product of the difference of the integers N and M and a predetermined frequency of the input signal for which zero transmission is desired is set equal to an odd integer multiple of one-half of the aforementioned one frequency.

4 Claims, 10 Drawing Figures

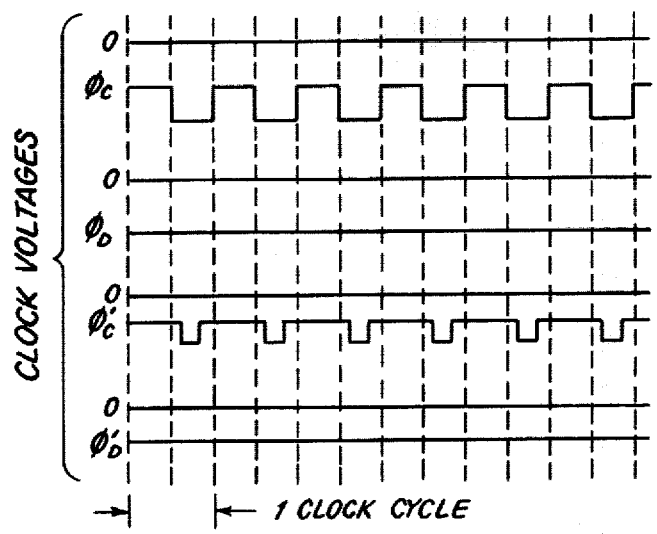
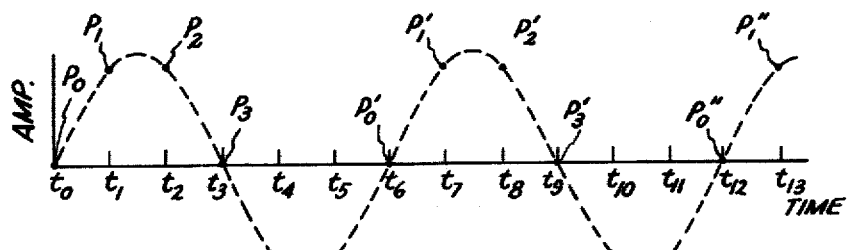
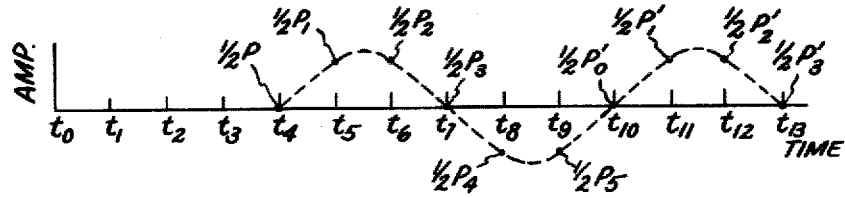
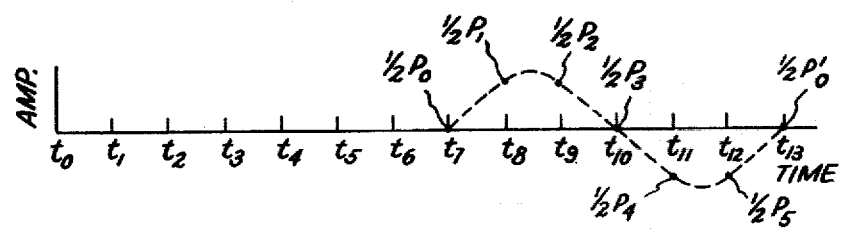

CHARGE DOMAIN FILTER WITH A PLURALITY OF TRANSMISSION ZEROS

The present invention relates in general to charge transfer signal processing apparatus for providing filter functions and more particularly for implementing transmission zeros.

A principal object of the present invention is to provide sampled data filter apparatus which provides transmission zeros at a plurality of frequencies.

In carrying out the invention in one illustrative embodiment there is provided a first shift register having a plurality of M stages, each stage including a respective first charge storage region. A second shift register is provided having a plurality of N stages where N is an integer greater than M, each stage including a respective first charge storage region. First means is provided for sequentially transferring packets of charge at one frequency from first charge storage region to first charge storage region of the stages of the first shift register. Second means is provided for sequentially transferring packets of charge at the aforesaid one frequency from first charge storage region to first charge storage region of the stages of second shift register. A first sequence of packets of charge is provided, each packet representing a respective sample of an input signal, successive packets being provided at the aforesaid one frequency. Means is provided for dividing each of said packets of charge of said first sequence into a first part and a second part equal to the first part. Means is provided for applying each of the first parts of the packets of the first sequence to the first stage of the first shift register and for applying each of the second parts of the packets of the first sequence to the first stage of the second shift register. The product of the difference of the integers N and M and a predetermined frequency of the input signal for which zero transmission is desired is set equal to an odd integer of one-half of the aforesaid one freuency.

The novel features which are believed to be characteristic of the present invention are set forth with particularity in the appended claims. The invention itself, both as to its organization and method of oepration, together with further objects and advantages thereof, may best be understood by reference to the following description taken in connection with the accompanying drawings wherein:

FIGS. 4A through 4D show diagrams of votage waveforms useful in explaining the operation of the apparatus of FIG. 1.

FIG. 5A is a diagram of a sequence of packets of charge applied at the input stage of the apparatus of FIG. 1.

FIG. 5B is a diagram of the sequence of packets of charge obtained at the output of the first shift register of the apparatus of FIG. 1 in response to the input sequence of FIG. 5A.

FIG. 5C is a diagram of the sequence of packets of charge obtained at the output of the second shift register of the apparatus of FIG. 1 in response to the input sequence of FIG. 5A.

Figure 1:
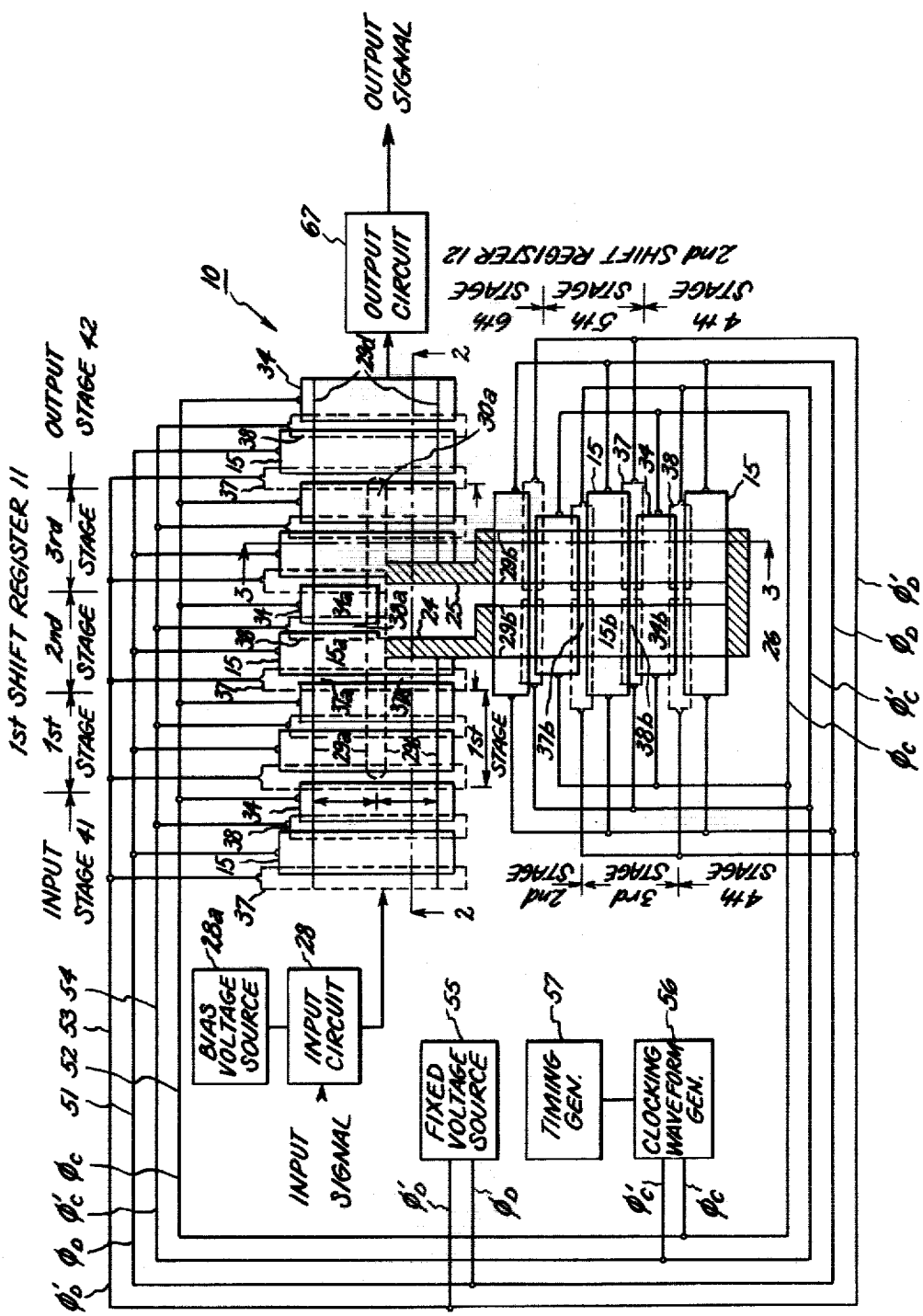
FIG. 1 shows a plan view of apparatus in accordance with the present invention.
Figure 2:
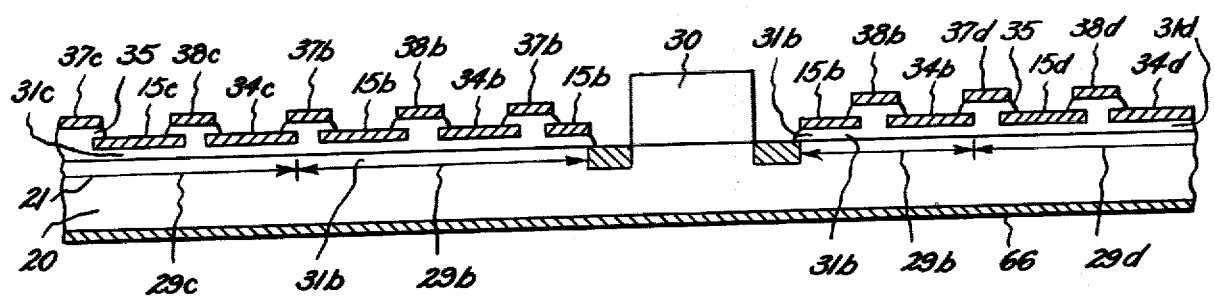
FIG. 2 shows a sectional view of the apparatus of FIG. 1 taken along section lines 2—2 of FIG. 1.
Figure 3:
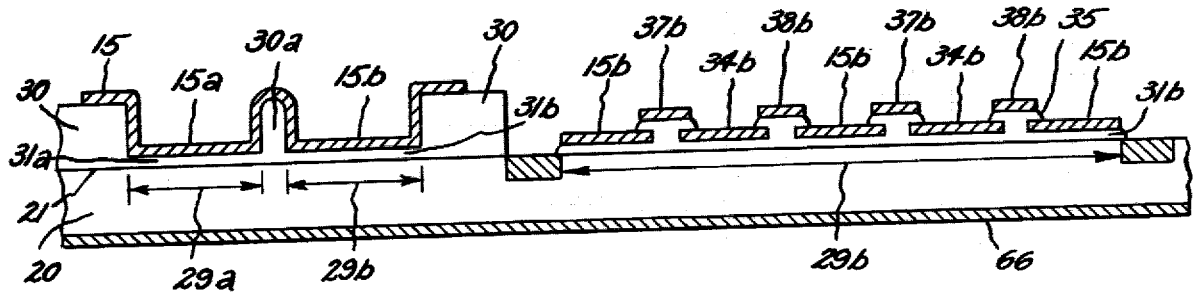
FIG. 3 shows a sectional view of the apparatus of FIG. 1 taken along section lines 3—3 of FIG. 1.

Reference is now made to FIGS. 1-3 which show apparatus 10 in accordance with the present invention. The apparatus is formed on a common semiconductor substrate 20 having a major surface 21 and comprises a first serial charge transfer shift register 11 of M stages, conveniently shown as three, and a second serial charge transfer shift register 12 of N stages and conveniently shown as six. Each stage of the first shift register 11 includes a respective first electrode 15a of generally rectangular outline insulatingly overlying the major surface of the substrate and providing a respective first storage region 16a therein. Each stage of the second shift register 12 includes a respective first electrode 15b of generally rectangular outline insulatingly overlying the major surface 21 of the substrate 22 and providing a respective first storage region 16b therein. The first storage region 16b of the first stage of the second shift register is located in tandem with the first storage region 16a of the last stage of the first shift register 11. An input stage 41 is provided coupled to the input of first stage of the first shift register 11 and also coupled to the input of the first stage of the second shift register 12. An output stage 42 is also provided coupled to output of the last stages of the first and second shift registers.

A sequence of packets of charge corresponding to samples of a signal from an input circuit 28 are serially applied to the input stage 41. The first storage regions of the first and second shift registers are coupled to the input stage such that in the process of transfer of charge from the input stage 41 to these regions during one-half of a clock charge transfer cycle, a charge packet is divided into equal first and second parts. During this first half of a clocking cycle the first part of an initial charge packet is clocked into the first storage region 16a of the first stage of the first shift register and stored therein and the second part of the charge packet is clocked into the first storage region 16b of the first stage of the second shift register and stored therein. During the second and third clock cycles the first part of the initial packet is clocked into the second and third stages of the first shift register. During the fourth clock cycle the first part of the initial packet is clocked into the first storage region of the output region stage 42. During the second through sixth clock cycles the second part of the initial packet is clocked into the second through sixth stages of the second shift register. During the seventh clock cycle the second part of the initial packet is clocked into the first storage region of the output stage. Successive packets of the sequence are similarly divided into two equal parts, transferred from stage to stage of the first and second shift registers, and then reinserted in the common output stage. As the number of stages of the first and second shift registers are different parts of different packets of the sequence are combined in the output stage and an output sequence of packets is obtained. The output sequence may be detected and an output signal is obtained.

In accordance with the present invention, to provide zero output response at a particular frequency $f_z$ of the input signal, the clock frequency $f_s$ is selected such that the product of the period $nT_s$ of the clock frequency and the different N-M in the number of stages in the first and second shift registers is equal to one-half of the period $T_z$ of the signal of frequency $f_z$. Thus, signals of frequency $f_z$ and also signals of odd multiples of frequency $f_z$ are delayed in phase by 180 degrees or odd multiples thereof in the second of shift register and hence cancel corresponding signals in the first shift register. Thus, $$(N - M) T_s = \frac{(2k + 1)}{2} T_z, \quad k = 0, 1, 2, \text{etc.} \quad (1)$$

or $$(N - M) = \frac{(2k + 1)}{2} \frac{f_s}{f_z}, \quad k = 0, 1, 2, \text{etc.}$$

This mode of operation of the apparatus of the present invention is further described in connection with FIGS. 5A–5C.

The apparatus 10 is formed on a semiconductor substrate 20 of N-type conductivity having a major surface 21. Typically, the substrate may be silicon semiconductor material of suitable resistivity, for example, 4 ohm-centimeters. The shift registers 11 and 12 are formed over parallel channel portions 29a and 29b of the substrate 20 adjacent the major surface 21. Overlying the major surface 21 of the substrate 20 is a thick insulating member 30 of silicon dioxide having thin portions 31a and 31b, for example 1000 Angstroms thick, lying in registry with the channel portions 29a and 29b respectively and separated by elongated thick insulating member 30a. A plurality of first conductors 15 of generally rectangular outline is provided on the insulating member 30 having portions 15a and 15b overlying thin portion 31a and 31b, respectively. Each of portions 15a and 15b of conductor 15 are referred to as first electrodes. A plurality of second conductors 34 is provided on the insulating member 30 having portions 34a and 34b overlying the thin portions 31a and 31b, respectively. Each portions 34a and 34b of conductor 34 are referred to as second electrodes. Another thin layer 35 of insulation, for example 1000 Angstroms thick, is provided over the conductors 15 and 34. A plurality of first and transfer conductors 37 are provided over the insulating layer 35 each including portions 37a and 37b referred to as first transfer electrodes. Each of the first transfer electrodes 37a is insulatingly spaced between a respective second electrode 34a and an adjacent succeeding first electrode 15a and overlying these electrodes. Each of the first transfer electrodes 37b is insulatingly spaced between a respective second electrode 34b and an adjacent succeeding first electrode 15b and overlying these electrodes. A plurality of second transfer conductors 38 are provided over the insulating layer 35, each including portions 38a and 38b referred to as second transfer electrodes. Each of the second transfer electrodes 38a is insulatingly spaced between a respective first electrode 15a and an adjacent succeeding second electrode 34a and overlying these electrodes. Each of the second transfer electrodes 38b is insulatingly spaced between a respective first electrode 15b and an adjacent succeeding second electrode 34b and overlying these electrodes. The first and second transfer conductors 37 and 38 are shown in dotted outline to illustrate with clarity the structure and organization of the apparatus.

As the second shift register 12 has a substantially greater number of stages than the first shift register 11, the channel portion 29b associated therewith is substantially longer than the channel portion 29a associated with the first shift register and cannot physically completely parallel channel portion 29a. The channel portion 29b includes initial and final portions which are physically parallel with respect to the initial and final parts of channel 29a and also includes a downward part and an upward part parallel thereto and orthogonal to the initial and final parts. An L-shaped region 24 of opposite conductivity type is provided in the substrate connecting adjacent ends of the initial and downward extending parts. Another L-shaped region 25 of opposite conductivity type is provided in the substrate connecting adjacent ends of the final and upward extending parts. An elongated region 26 of opposite conductivity type is provided in the substrate connecting adjacent ends of downward and upward extending parts. The L-shaped region 24 connects the two parts of the first charge region of the second state of the second shift register 12. The L-shaped region 25 connects the two parts of the first charge storage region of the sixth stage of the second shift register 12. The elongated region 26 connects the two parts of the first charge storage region of the fourth stage of the second shift register 12.

All of the first electrodes 15a and 15b of the shift registers 11 and 12 and connected to a line 51 to which a voltage is supplied from a fixed voltage source 55. All of the second electrodes 34a and 34b of the first and second shift registers 11 and 12 are connected to line 52 to which a $\phi_C$ voltage is supplied from a clocking waveform generator 56. The clocking waveform generator 56 is under the control of the timing generator 57. All of the first transfer electrodes 37a and 37b of the shift registers 11 and 12 are connected to a $\phi_D'$ line 53 to which a $\phi_D'$ voltage is supplied from fixed voltage source 55. All of the second transfer electrodes 38a and 38b of the shift registers 11 and 12 are connected to $\phi_C'$ line 54 to which a $\phi_C'$ voltage is applied from a clocking waveform generator 56. The $\phi_C$, $\phi_D$, $\phi_C'$, and the $\phi_D'$ voltage waveforms are shown in FIGS. 4A through 4D, respectively. A conductive layer 66 of a suitable material such as gold is eutectically bonded to the lower surface of the substrate 20 to provide a substrate contact to which the ground lines of the $\phi_D$, $\phi_D'$, $\phi_C$, and $\phi_C'$ voltage sources are connected.

Each set of electrodes 37a, 15a, 38a, and 34a serially arranged on a respective thin portion 31a of the insulating member 30 and overlying a respective part of channel 29a form a stage of first shift register 11. Each set of electrodes 37b, 15b, 38b, and 34b, serially arranged on a respective thin portion 31b of the insulating member 30 and overlying a respective part of channel 29b, form a stage of second shift register 12.

Each stage of the first shift register 11 includes a $\phi_D$ or first storage region underlying a $\phi_D$ electrode 15a and $\phi_C$ or second storage region underlying a $\phi_C$ electrode 34a. The $\phi_D$ voltage applied to the $\phi_D$ electrode is fixed and produces a surface potential in the substrate underlying the $\phi_D$ electrode which is fixed. The $\phi_C$ voltage applied to the $\phi_C$ electrode cycles between a high level and a low level above and below the $\phi_D$ voltage and produces a surface potential in the substrate underlying the $\phi_C$ electrode which cycles between a level above and below the fixed level underlying a $\phi_D$ electrode. When the $\phi_D$ voltage is at its high level, charge transfer is enabled from the $\phi_C$ storage region to the $\phi_D$ storage region, and conversely when the $\phi_C$ voltage is at its low level, charge transfer from the $\phi_D$ storage region to the $\phi_C$ storage region is enabled. Each stage also includes a $\phi_D'$ electrode 37a to which is applied a $\phi_D'$ voltage of fixed value which produces a surface potential in the substrate underlying the electrode which is smaller in absolute magnitude than the surface potential underlying a $\phi_D$ electrode. Each stage also includes a $\phi_C'$ electrode 38a to which is applied a $\phi_C'$ voltage having two levels. At the upper level a surface potential is produced in the substrate underlying the electrode which inhibits the transfer of charge from a $\phi_D$ storage region to a $\phi_C$ storage region. At the lower level a surface potential is produced enabling the transfer of charge from a $\phi_D$ storage region to a $\phi_C$ storage region. Thus, when the $\phi_C$ voltage is at its high level, charge is transferred from a $\phi_C$ storage cell to a $\phi_D$ storage cell, and when both the $\phi_C$ voltage and the $\phi_C'$ voltage are at their low levels, charge is transferred from $\phi_D$ storage cell to a $\phi_C$ storage cell. For each cycle of the clocking voltages $\phi_C$ and $\phi_C'$, charge is transferred from a $\phi_C$ storage cell to a $\phi_D$ storage cell and then to the next succeeding $\phi_C$ storage cell.

Each stage of the second shift register 12 also includes a $\phi_D$ storage region underlying a $\phi_D$ electrode 15b and a $\phi_C$ storage region underlying a $\phi_C$ electrode 34b, a $\phi_D'$ electrode 37b, and a $\phi_C'$ electrode 38b. The manner in which charge is clocked from storage region to storage of the second shift register 12 is identical to the manner in which charge is clocked from storage region to storage region in the first shift register 11.

The input stage 41 is formed on a channel portion 29c of the substrate 20 which is contiguous to channel portion 29a and 29b and of a width equal to the sum of the widths of these channels. A thin portion 31c is provided in thick insulating member 30 lying in registry with the channel portion 29c. A first electrode 15c of generally rectangular outline is provided on the insulating member 30 overlying the thin portion 31c. A second electrode 34c is provided on the insulating member 30 overlying the thin portion 31c. An insulating layer 35 is provided over the electrodes 15c and 34c. A first transfer electrode 37c is provided over the insulating layer 35. The first transfer electrodes 37c is in front of and insulatingly overlying first electrode 15c. A second transfer electrode 38c is provided over the insulating layer 35. The second transfer electrode 38c is spaced between a first electrode 15c and the second electrode 34c and insulatingly overlying these electrodes.

The output stage 42 is formed on a channel portion 29d of the substrate 20 which is contiguous to channel portion 29a and 29b and of a width equal to the sum of the width of these channels. A thin portion 31d is provided in thick insulating member 30 lying in registry with the channel portion 29d. A first electrode 15d of generally rectangular outline is provided on the insulating member 30 overlying the thin portion 31d. A second electrode 34d is provided on the insulating member 30 overlying the thin portion 31d. An insulating layer 35 is provided over the electrodes 15d and 34d. A first transfer electrode 37d is provided over the insulating layer 35 spaced in front of and insulatingly overlying first electrode 33d. A second transfer electrode 38d is spaced between a first electrode 15d and the second electrode 34d and insulatingly overlying these electrodes.

The first electrodes 15c and 15d of the input and output stages 12 are connected to line 51 to which a $\phi_D$ voltage is supplied from a fixed voltage source 55. The second electrodes 34c and 34d of the input and output stages are connected to line 52 to which a $\phi_C$ voltage is supplied from a clocking waveform generator 56. The first transfer electrodes 37c and 37d of the input and output stages are connected to a $\phi_D'$ line 53 to which a $\phi_D'$ voltage is supplied from fixed voltage source 55. The second transfer electrodes 38c and 38d of the input and output stages are connected to a $\phi_C'$ line 54 to which a $\phi_C'$ voltage is applied from a clocking waveform generator 56.

Packets of charge for insertion into the input stage are generated by an input circuit 28 in response to an input signal. Input circuits such as input circuit 28, as well-known in the art, one of which is described in connection with FIGS. 8A, 8B and 8C in the U.S. Pat. No. 4,032,867, assigned to the assignee of the present invention and incorporated herein by reference thereto. This particular circuit is referred to as a "fill and spill" circuit. Of course, other input circuits may be utilized. A bias voltage source 28a connected to the input circuit 28 provides a fixed bias charge component to each packet of charge developed by the input circuit 28a which facilitates the transfer thereof. The output of the input circuit 28 is applied to the input stage 41.

Packets of charge from the output stage 42 are sensed or detected by an output circuit 67. An output circuit suitable for providing an output in accordance with the sequence of packets of charge clocked thereinto is described in connection with FIG. 6 of patent application Ser. No. 105,756, filed Dec. 20, 1979, assigned to the assignee of the present invention and incorporated herein by reference thereto.

The operation of the apparatus of FIGS. 1-3 will now be explained in connection with the diagrams of FIGS. 6A-6C. FIG. 6A shows a first sequence of six packets of charge representing samples $P_0$-$P_5$ of a sine wave signal sampled at times $t_0$-$t_5$ corresponding to phase points of $0°, \pi/3, 2\pi/3, \pi, 4/3\pi, 5/3\pi$, respectively. The packets of charge are serially applied to the first storage region of the input stage at times $t_0$-$t_5$. Each of the charge packets $P_0$-$P_5$ are split into equal first and second parts. The first parts are clocked from stage to stage of the first shift register to the output stage. The second parts are clocked from stage to stage of the second shift register. At the time $t_4$, the first part of packet $P_0$ has been clocked into the first storage region of the output stage, and the first parts of successive packets $P_1$-$P_5$ appear in the output stage at successive intervals of time. At time $t_7$, the second part of the first packet has been clocked into the first storage region of the output stage, and the second parts of packets $P_1$-$P_5$ appear in the output stage at successive clock periods. At time $t_7$, the first part ($\frac{1}{2} P_3$) of packet $P_3$, and the second part ($\frac{1}{2} P_0$) of packet $P_0$ appear in the first storage region of the output stage. As $P_0$ and $P_3$ are zero in magnitude, the resultant packet has a magnitude of zero. At time $t_8$, the first part ($\frac{1}{2} P_4$) of packet $P_4$ and the second part ($\frac{1}{2} P_1$) of packet $P_1$ appear in the first storage region of the output stage. As $P_1$ is positive, it is represented by an increment of charge to the bias charge packet in the apparatus. As $P_4$ is negative, it is represented by a decrement of charge from a bias charge packet, and as the magnitudes of $P_1$ and $P_4$ are equal, the resultant output again has a magnitude of zero. Similarly, at successive times $t_9, t_{10}, T_{11}, t_{12}$ and $t_{13}$, the first and second parts of different packets clocked into the first storage region of the output stage cancel and produce packets of zero level or value. For successive sequences denoted by successive primes, for example, second sequence $P_0'$-$P_5'$, and third sequence $P_0'$-$P_5'$, the same result is obtained. Thus, when the sampling or clocking period $T_s$ multiplied by the difference $(N-M)$ in the number of stages in the first and second shift registers is set equal to one-half the period $T_z$ of sine wave being sampled, the resultant output is zero. Thus, $$T_s \times (N-M) = \tfrac{1}{2} T_z,$$

or $$N - M = \frac{1}{2} f_s/f_z$$

where $f_s$ is the clock frequency and $f_z$ is the signal frequency. Zero transmission of the signal frequencies which are odd multiples of the frequency $f_z$ also is obtained as was explained above.

While in FIG. 1 a filter is shown and described to which a unipolar input is applied and from which a unipolar output is obtained, it will be understood that the filter apparatus may be used in bipolar filter systems in which both positive weighted and negative weighted input signals are provided and from which both positive and negative weight outputs are obtained. In such a system two identical structures such as shown in FIG. 1 would be provided. The positive weighted signal would be applied to the input of one of the structures and the negative weighted signal would be applied to the other structure. At the output of the first structure a positive weighted output would be obtained and at the output of the other structure a negative weighted output would be obtained. Such a bipolar system may be readily cascaded with other similarly constituted bipolar charge transfer filter systems, such as described and claimed in U.S. patent application Ser. No. 105,759, filed Dec. 20, 1979, and assigned to the assignee of of the present application. In such a bipolar system the output signal is recovered by differentially summing corresponding samples of the positive and negative weighted output sequences.

While the filter of FIGS. 1-4 utilizes charge transfer devices in which charge storage and transfer occurs in cells adjacent the surface of the semiconductor substrate, the present invention may be implemented with cells of opposite conductivity type regions. Structures of this type, commonly referred to as buried channel charge transfer devices are described in U.S. Pat. No. 3,902,187, assigned to the assignee of the present invention and incorporated herein by reference thereto. In such buried channel charge transfer devices charge storage and transfer occurs in cells below the surface of the semiconductor substrate. Implementation of prior art charge transfer filters with buried channel devices has particular advantages with respect to high speed operation, but suffers from nonlinearities resulting from the variable capacitance between the charge storage cells and their associated overlying electrodes. In the present invention such nonlinearities are not introduced into the output. In connection with a buried channel implementation, of course, surface charge input circuits such as those described above could be used.

The filter apparatus of the present invention may also be implemented in bucket brigade technology; however, such implementation would be less advantageous than in the charge coupled technology shown and described in FIGS. 1-4, as bucket brigade devices are subject to charge transfer inaccuracies which limit their performance.

While the invention has been described in specific embodiments in which single phase clocking systems have been employed, it will be understood that other clocking systems such as multi-phase clocking systems may as well be employed.

While the invention has been described in connection with apparatus constituted of N-type conductivity substrates, P-type conductivity substrates could as well be used. Of course, in such a case the applied potentials would be reversed in polarity.

While the invention has been described in specific embodiments, it will be understood that modifications, such as those described above, may be made by those skilled in the art, and it is intended by the appended claims to cover all such modifications and changes as fall with the true spirit and scope of the invention.

What I claim as new and desire to secure by Letters Patent of the United States is:

1. In combination,
    a first shift register having a plurality of M stages, where M is an integer, each stage including a respective first charge storage region,
    a second shift register having a plurality of N stages where N is an integer greater than M, each stage including a respective first charge storage region,
    first means for sequentially transferring packets of charge at one frequency from first charge storage region to first charge storage region of the stages of said first shift register,
    second means for sequentially transferring packets of charge at said one frequency from first charge storage region to first charge storage region of the stages of said second shift register,
    means providing a first sequence of packets of charge, each packet representing a respective sample of an input signal, successive packets being provided at said one frequency,
    means for dividing each of said packets of charge of said first sequence into a first part and a second part, said first and second parts being equal,
    means for applying each of said first parts of said packets of said first sequence to the first stage of said first shift register and for applying each of said second parts of said packets of said first sequence to the first stage of said second shift register,
    the product of the difference of said integers N and M and a predetermined frequency of said input signal being equal to an odd integer of one-half of said one frequency,
    means for combining the output of the last stage of said first shift register with the output of the last stage of said second shift register, whereby a resultant output is obtained having zero response at odd multiples of said predetermined frequency.

2. The combination of claim 1 in which said odd multiple is one.

3. The combination of claim 1 in which said first charge storage regions of said first shift register and said second shift register are formed in a substrate of semiconductor material.

4. The combination of claim 3 in which said first charge storage regions are formed adjacent a major surface of said substrate of semiconductor material.

* * * * *